United States Patent
Lin et al.

(10) Patent No.: US 10,187,108 B2
(45) Date of Patent: Jan. 22, 2019

(54) LOW LOSS ANTENNA SWITCH

(71) Applicant: AIROHA TECHNOLOGY CORP., Hsinchu (TW)

(72) Inventors: Heng-Chih Lin, Hsinchu (TW); Chien-Kuang Lee, Hsinchu (TW); Ping-Han Ho, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 103 days.

(21) Appl. No.: 15/001,377

(22) Filed: Jan. 20, 2016

(65) Prior Publication Data

US 2016/0240920 A1    Aug. 18, 2016

Related U.S. Application Data

(60) Provisional application No. 62/116,982, filed on Feb. 17, 2015.

(51) Int. Cl.
| | |
|---|---|
| *H01P 1/15* | (2006.01) |
| *H03K 17/693* | (2006.01) |
| *H04B 1/48* | (2006.01) |
| *H04B 1/44* | (2006.01) |

(52) U.S. Cl.
CPC .............. *H04B 1/48* (2013.01); *H03K 17/693* (2013.01); *H04B 1/44* (2013.01)

(58) Field of Classification Search
CPC ................................ H01P 1/15; H03K 17/693
USPC .................................................. 333/101, 103
See application file for complete search history.

(56) References Cited

U.S. PATENT DOCUMENTS

| | | | | |
|---|---|---|---|---|
| 5,748,053 | A * | 5/1998 | Kameyama | H03K 17/693 327/404 |
| 7,492,238 | B2 * | 2/2009 | Nakatsuka | H03K 17/693 333/101 |
| 8,170,500 | B2 * | 5/2012 | Seshita | H03K 17/693 333/103 |
| 8,244,199 | B2 * | 8/2012 | Goto | H01L 21/823425 257/280 |
| 8,786,002 | B2 * | 7/2014 | Kondo | H01L 29/93 257/296 |
| 9,397,656 | B2 * | 7/2016 | Dribinsky | H03K 17/102 |
| 9,503,081 | B2 * | 11/2016 | Yang | H03K 17/102 |
| 9,614,520 | B2 * | 4/2017 | Kunishi | H03K 17/6871 |
| 9,620,424 | B2 * | 4/2017 | Blin | H01L 21/84 |
| 2005/0239415 | A1 * | 10/2005 | Sagae | H04B 1/48 455/78 |
| 2005/0270083 | A1 * | 12/2005 | Nakatsuka | H01L 27/0207 327/430 |

(Continued)

*Primary Examiner* — Dean Takaoka
(74) *Attorney, Agent, or Firm* — Rosenberg, Klein & Lee

(57) ABSTRACT

The present invention relates to a low loss antenna switch. The antenna switch comprises a plurality of switch module and a plurality of transmitting/receiving terminals, wherein one end of each switch module is connected to an antenna unit and the other end of each switch module is connected to each transmitting and receiving end respectively. Further, each switch module comprises a plurality of switch units in series, wherein the width of at least one switch unit is smaller than other switch units of each switch module. Thus, the parasitic capacitance of the off-stage switch modules can be reduced, and VSWR (Voltage Standing Wave Ratio) of the antenna switch also can be improved.

8 Claims, 4 Drawing Sheets

(56) References Cited

U.S. PATENT DOCUMENTS

2008/0174357 A1* 7/2008 Matsuda ............. H01L 29/4238
                                              327/427
2012/0112832 A1* 5/2012 Kawano ................ H03F 3/72
                                              327/427
2013/0072134 A1* 3/2013 Goto .................... H04B 1/109
                                              455/78
2014/0220909 A1* 8/2014 Kunishi ............. H01L 27/1203
                                              455/78

* cited by examiner

LOW LOSS ANTENNA SWITCH

REFERENCE TO RELATED APPLICATIONS

This application is based on Provisional application Ser. No. 62/116,982, filed Feb. 17, 2015, currently pending.

FIELD OF THE INVENTION

The present invention relates to a low loss antenna switch for reducing parasitic capacitance generated by the off state switch module.

BACKGROUND

FIG. 1 is a circuit diagram of a common antenna switch. The antenna switch 10 comprises an antenna unit 11 and a plurality of switch units 13. One end of each switch unit 13 is connected to the antenna unit 11, and the other end of each switch unit 13 is connected to different transmitting/receiving terminals 15 to switch the connection of the antenna unit 11 and each transmitting/receiving terminal 15.

In actual application, one of switch units 13 is turned on, and other switch units 13 are turned off, and the antenna unit 11 is able to be electrically connected to one of transmitting/receiving terminals 15 via the on state switch unit 13. Thus, the RF signal received by the antenna unit 11 is able to be transmitted to the transmitting/receiving terminal 15 that is electrically connected to the antenna unit 11, or the RF signal can be transmitted from the transmitting/receiving terminal 15 to the antenna unit 11. Further, each transmitting/receiving terminal 15 may be used to transmit or receive RF signals with different frequency band.

However, the parasitic capacitance may be generated by each off state switch unit 13. Moreover, each off state switch unit 13 is connected in parallel to generate large parasitic capacitance. Thus, the insertion loss of the antenna switch 10 may be increased and may cause loss of the RF signal passing through the antenna switch 10.

SUMMARY

It is one object of the present invention to provide a low loss antenna switch. The low loss antenna switch comprises a plurality of switch modules, and each switch module comprises a plurality of switch units in series. The width of at least one switch unit is smaller than other switch units of each switch module to reduce parasitic capacitance of the antenna switch and loss of the RF signal passing through the antenna switch, and improve the VSWR (Voltage Standing Wave Ratio) of the antenna switch.

For achieving above objects, the present invention provides a low loss antenna switch, comprising: a plurality of transmitting/receiving terminals; and a plurality of switch modules, each the switch module comprising two ends, one end of each the switch module connected to an antenna unit, and the other end of each the switch module respectively connected to each the transmitting/receiving terminal, wherein each the switch module comprises a plurality of switch units connected in series, and each switch unit comprises a width, wherein the width of at least one the switch unit is smaller than the width of other switch units.

Further, the invention provides another low loss antenna switch, comprising: a plurality of first stage switch modules electrically connected to an antenna unit, wherein each the first stage switch module comprises a plurality of first stage switch units in series; and a plurality of second stage switch modules electrically connected to each the first stage switch module respectively, wherein each the second stage switch module comprises a plurality of second stage switch units in series, and the first stage switch unit and the second stage switch unit comprise a width, wherein the width of the first stage switch unit closest to the antenna unit and the second switch module is smaller than other first stage switch units of the first stage switch module, and the width of the second stage switch unit closest to the first switch module is smaller than other second stage switch units of the second stage switch module.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
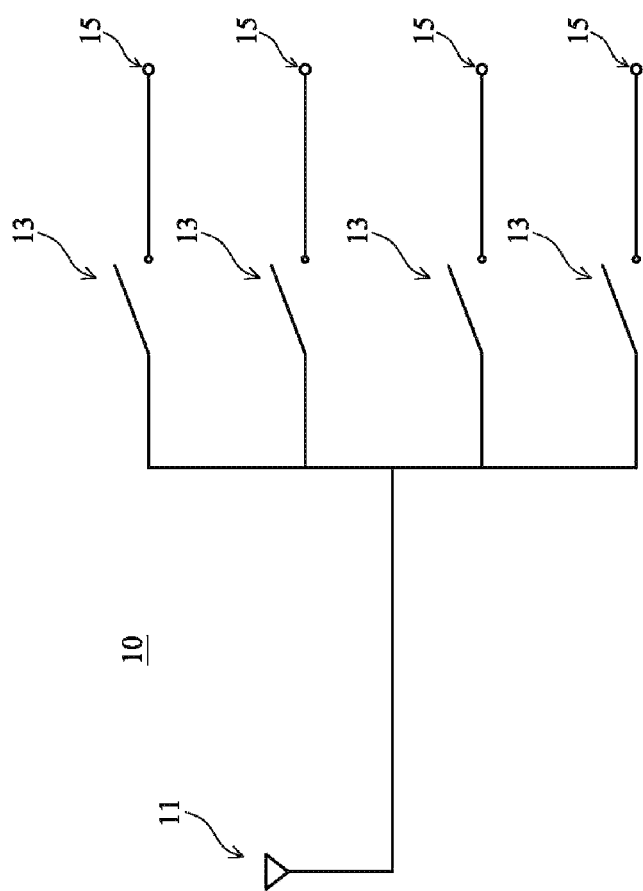
FIG. 1 is a circuit diagram of a common antenna switch.
Figure 2:
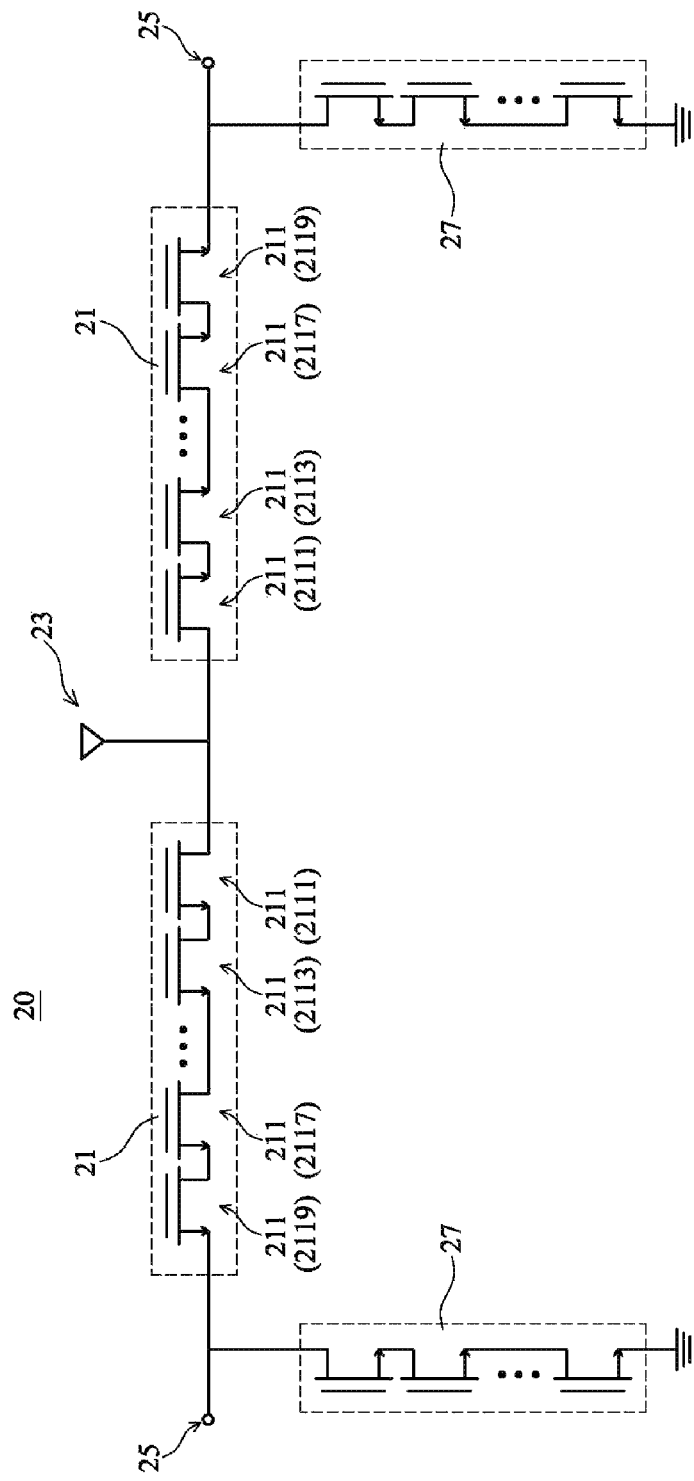
FIG. 2 is a circuit diagram of a low loss antenna switch according to an embodiment of the present invention.

FIG. 2 is a circuit diagram of a low loss antenna switch according to an embodiment of the present invention. The antenna switch 20 comprises a plurality of switch modules 21, wherein one end of each switch module 21 is connected to an antenna unit 23, and the other end of each switch module 21 is connected to different transmitting/receiving terminals 25 respectively.

In actual application, each switch module 21 is able to be turned on or turned off respectively. For instance, one of switch modules 21 is turned on, and another switch module 21 is turned off, and the antenna unit 23 is able to be connected to one of transmitting/receiving terminals 25 via the on state switch module 21. Thus, the RF signal received by the antenna unit 23 can be transmitted to one of transmitting/receiving terminals 25 via the on state switch module 21, or the RF signal can be transmitted to the antenna unit 23 from one of transmitting/receiving terminals 25 via the on state switch module 21.

Each switch module 21 comprises a plurality of switch units 211 in series. Further, each switch unit 211 has a width, and the width of at least one switch unit 211 is smaller than other switch units 211 of each switch module 21. For instance, the width of at least one switch unit 211 is smaller than 80 percent of the width of other switch units 211.

In one embodiment of the invention, the width of one or two switch units 211 closest to the antenna unit 23 is smaller than other switch units 211 of each switch module 21. Each switch unit 211 comprises a plurality of transistors in parallel, such as MOSFET (Metal-Oxide-Semiconductor Field-Effect Transistor), and the width of each switch unit 211 is combination of the width of transistors thereof in parallel, such as combination of the channel width of each MOSFET.

In generally, transistors may be shown as finger-type transistors in traditional VLSI lay out. In the embodiment of the invention, each transistor of each switch unit 211 may have same specification and same width. Thus, the width of each switch unit 211 equals the width of transistor times the number of fingers.

As each transistor of each switch unit 211 has same specification, the number of fingers of one or two switch unit 211 closest to the antenna unit 23 is less than other switch units 211 of each switch module 21, or the number of transistors of one or two switch units 211 closest to the antenna unit 23 is less than other switch units 211 of each switch module 21.

In above embodiment of the invention, the width of one or two switch units 211 closest to the antenna unit 23 is a smaller one, and widths of other switch units 211 are similar each other. In another embodiment of the invention, the width of each switch unit 211 of each switch module 21 may be different, and the width of each switch unit 211 of each switch module 21 may be reduced from the transmitting/receiving terminal 25 to the antenna unit 23 to reduce parasitic capacitance generated by the off state switch module 21.

In particular embodiment, each switch module 21 may comprise a first switch unit 2111, a second switch unit 2113, . . . , a (n−1)th switch unit 2117 and a nth switch unit 2119 connected in series in turn, wherein the first switch unit 2111 is closest to the antenna unit 23 and the nth switch unit 2119 is farthest from the antenna unit 2111. In one embodiment of the invention, the width of the first switch unit 2111 is smaller than the second switch unit 2113, . . . , and the width of the (n−1)th switch unit 2117 is smaller than nth switch unit 2119.

In one embodiment of the invention, each switch module 21 may be connected to a ground terminal via a ground switch module 27. For instance, one end of the ground switch module 27 is electronically connected with the switch module 21 and the transmitting/receiving terminal 25, and the other end of the switch module 21 is connected to the ground terminal. Thus, each switch module 21 is able to be connected to the ground terminal by switching each ground switch module 27 respectively.

The antenna switch 20 may comprise one antenna unit 23 and two switch modules 21 and transmitting/receiving terminals 25, as shown in FIG. 2. The antenna unit 23 is electronically connected with two switch modules 21, and connected to two transmitting/receiving terminals 25 via two switch modules 21 respectively. In other embodiment of the invention, the antenna switch 20 may comprise two or more than two antenna units 23, transmitting/receiving terminals 25 and switch modules 21.

In actual application, as one of switch modules 21 of the antenna switch 20 is turned on, another switch module 21 is turned off. The width of one or two switch units 211 closest to the antenna unit 23 is smaller than other switch units 211 to reduce the area of overlap between the antenna unit 23 and the closest and/or the second close switch units 211. For instance, the antenna unit 23 and switch units 211 may comprise at least one conductive unit, and the area of overlap between the conductive unit of the antenna unit 23 and the conductive unit of the closest and/or the second close switch units 211 can be reduced by reducing width of the closest and/or the second close switch units 211. Thus, the parasitic capacitance generated by the antenna unit 23 and the off state switch modules 21 can be reduced to improve loss of RF signal and VSWR (Voltage Standing Wave Ratio) of the antenna switch 20.

Figure 3:
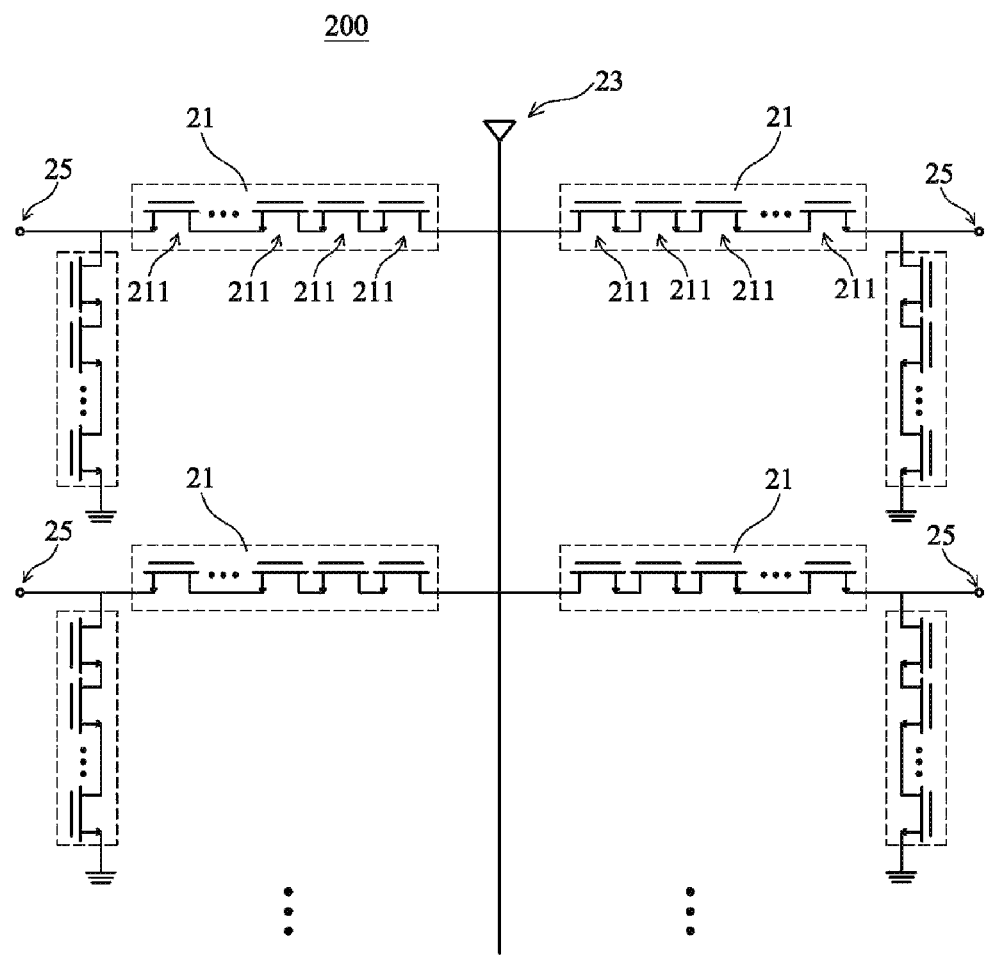
FIG. 3 is a circuit diagram of a low loss antenna switch according to another embodiment of the present invention.

In other embodiment of the invention, the antenna switch 200 comprises more than two switch modules 21 and transmitting/receiving terminals 25, as shown in FIG. 3.

When one of switch modules 21 is turned on, other switch modules 21 are turned off. Further, each off state switch module 21 is connected in parallel, and parasitic capacitances generated by each off state switch module 21 are also connected in parallel to generate a large parasitic capacitance.

In the invention, the width of one or two switch units 211 closest to the antenna unit 23 is smaller than other switch units 211 of each switch module 21, or widths of those switch units 211 of each switch module 21 are reduced from transmitting/receiving terminal 25 to the antenna unit 23. Thus, the parasitic capacitance generated by the antenna unit 23 and the off state switch modules 21 can be reduced to reduce parasitic capacitance of the antenna switch 200 and loss of the RF signal passing through the antenna switch 200.

Figure 4:
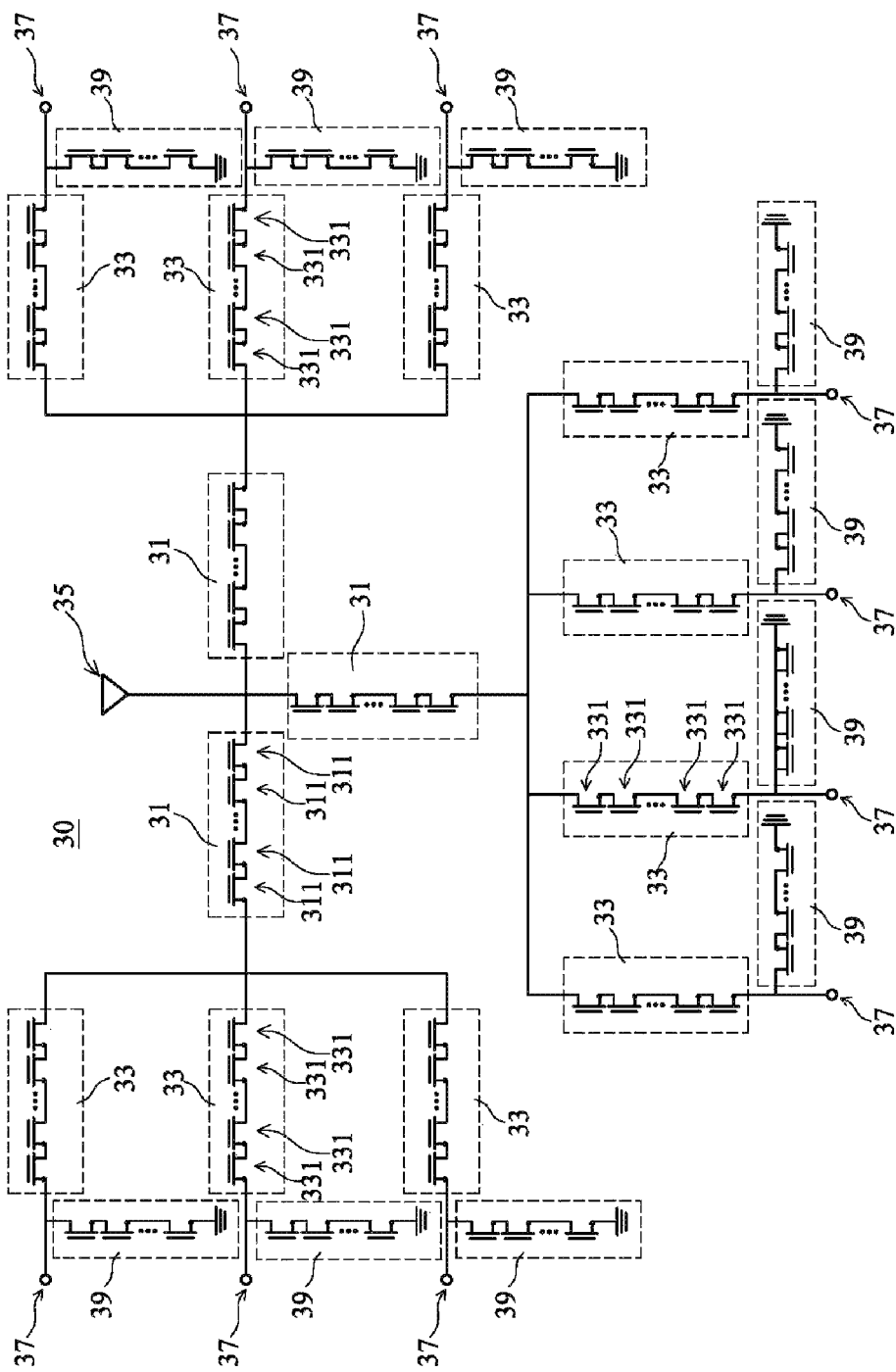
FIG. 4 is a circuit diagram of a low loss antenna switch according to another embodiment of the present invention.

FIG. 4 is a circuit diagram of a low loss antenna switch according to another embodiment of the present invention. The antenna switch 30 comprises a plurality of first stage switch modules 31 and a plurality of second stage switch modules 33. One end of each first stage switch module 31 is connected to an antenna unit 35, and the other end of each first stage switch module 31 is connected to one end of a plurality of second stage switch modules 33 respectively. Further, the other end of each second stage switch module 33 is connected to different transmitting/receiving terminals 37 respectively.

The first stage switch module 31 comprises a plurality of first stage switch units 311 in series, wherein the width of one or two first stage switch units 311 closest to the antenna unit 35 and the second stage switch module 33 is smaller than other first stage switch units 311 of each first stage switch module 31.

The second stage switch module 33 comprises a plurality of second stage switch units 331 in series, wherein the width of one or two second stage switch units 331 closest to the first stage switch module 31 is smaller than other second stage switch units 331 of each second stage switch module 33.

The first stage switch unit 311 of the first stage switch module 31 and the second stage switch unit 331 of the second stage switch module 33 comprise a plurality of transistors in parallel, such as MOSFETs in parallel. The width of the first stage switch unit 311 and the second stage switch unit 331 is combination of the width of those transistors thereof in parallel respectively, such as combination of the channel width of each MOSFET of the first or second stage switch unit 311/331.

The width of one or two first stage switch units 311 closest to the antenna unit 35 is smaller than other first stage switch units 311 of the first stage switch module 31 to reduce the area of overlap between the antenna unit 35 and the closest and/or the second close first stage switch units 311. For instance, the parasitic capacitance generated by the antenna unit 35 and the first stage switch module 31 is able to be reduced by reducing the area of overlap between the conductive unit of the antenna unit 35 and the conductive unit of the closest and/or the second close first stage switch units 311.

Further, the width of one or two first stage switch units 311 closest to the second stage switch module 33 is smaller than other first stage switch units 311 of the first stage switch module 31, and the width of one or two second stage switch units 331 closest to the first stage switch module 31 is smaller than other second stage switch units 331 of the second stage switch module 33. Thus, the area of overlap between closest first and second stage switch units 311/331 can be reduced. For instance, the parasitic capacitance generated by the first stage switch module 31 and the second stage switch module 33 is able to be reduced by reducing the area of overlap between the conductive unit of the first switch unit 311 and the conductive unit of the second stage switch unit 331, wherein the first switch unit 311 is closest to the second stage switch unit 331 each other.

In one embodiment of the invention, each second stage switch module 33 may be connected to a ground terminal via a ground switch module 39 respectively. For instance, one end of the ground switch module 39 is electronically connected to the second stage switch module 33 and the transmitting/receiving terminals 37, and the other end of the ground switch module 39 is connected the ground terminal. Thus, each second stage switch module 33 is able to be connected to the ground terminal by switching each ground switch module 39 respectively.

In actual application, one of first stage switch modules 31 is turned on, one of second stage switch modules 33 connected with the first stage switch module 31 is turned on, and other first stage switch modules 31 and second stage switch modules 33 are turned off. Thus, the antenna unit 35 is able to be connected to one of transmitting/receiving terminals 37 via the on state first and second stage switch modules 31/33 to transmit RF signal with the transmitting/receiving terminal 37.

The parasitic capacitance generated by the off state first and second stage switch modules 31/33 can be reduced by using the antenna switch 30 of the invention. Thus, the large parasitic capacitance generated by the off state switch modules in parallel of the prior art, and loss of RF signal passing through the antenna switch 30 can be reduced.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. A low loss antenna switch, comprising:
    a plurality of transmitting/receiving terminals; and
    a plurality of switch modules, each said switch module including two ends, one end of each said switch module connected to an antenna unit, and the other end of each said switch module respectively connected to each said transmitting/receiving terminal, wherein each said switch module includes a plurality of switch units connected in series, and each switch unit includes a width, wherein said switch units of at least one said switch module being disposed in series with consecutive switch units, each of said consecutive switch units having a reduced width with respect to a previous switch unit from said transmitting/receiving terminal to said antenna unit.

2. The low loss antenna switch according to claim 1, further including a plurality of ground switch modules, each of said plurality of ground switch modules being connected to between a ground terminal and each a corresponding one of said switch modules.

3. The low loss antenna switch according to claim 1, wherein each said switch unit includes a plurality of transistors in parallel.

4. The low loss antenna switch according to claim 3, wherein said width of each said switch unit is combination of said width of said transistors thereof.

5. The low loss antenna switch according to claim 3, wherein the number of said transistors of said switch unit closest to said antenna unit is smaller than other switch units of each said switch module.

6. A low loss antenna switch, comprising:
    a plurality of first stage switch modules electrically connected to an antenna unit, wherein each said first stage switch module includes a plurality of first stage switch units in series; and
    a plurality of second stage switch modules electrically connected to each said first stage switch module respectively, wherein each said second stage switch module includes a plurality of second stage switch units in series, and said first stage switch unit and said second stage switch unit include a width, wherein said width of said first stage switch unit closest to said antenna unit and said second switch module is smaller than other first stage switch units of said first stage switch module, and said width of said second stage switch unit closest to said first switch module is smaller than other second stage switch units of said second stage switch module.

7. The low loss antenna switch according to claim 6, wherein said width of two said first stage switch units closest to said antenna unit and said second stage switch module is smaller than other said first stage switch units of said first stage switch module.

8. The low loss antenna switch according to claim 6, wherein said first stage switch unit and said second stage switch unit include a plurality of transistors in parallel.

* * * * *